(12) United States Patent
Ito et al.

(10) Patent No.: US 12,418,153 B2
(45) Date of Patent: Sep. 16, 2025

(54) METHOD FOR MANUFACTURING CONNECTION BODY, AND CONNECTION BODY

(71) Applicant: DEXERIALS CORPORATION, Shimotsuke (JP)

(72) Inventors: Ryo Ito, Tochigi (JP); Yasunobu Yamada, Tochigi (JP); Daisuke Sato, Tochigi (JP)

(73) Assignee: DEXERIALS CORPORATION, Shimotsuke (JP)

( * ) Notice: Subject to any disclaimer, the term of this patent is extended or adjusted under 35 U.S.C. 154(b) by 394 days.

(21) Appl. No.: 17/797,855

(22) PCT Filed: Jan. 29, 2021

(86) PCT No.: PCT/JP2021/003371
§ 371 (c)(1),
(2) Date: Aug. 5, 2022

(87) PCT Pub. No.: WO2021/157490
PCT Pub. Date: Aug. 12, 2021

(65) Prior Publication Data
US 2023/0070488 A1 Mar. 9, 2023

(30) Foreign Application Priority Data

Feb. 7, 2020 (JP) .................................. 2020-019992
Jan. 29, 2021 (JP) .................................. 2021-013646

(51) Int. Cl.
*H01R 43/02* (2006.01)
*H01R 12/57* (2011.01)

(52) U.S. Cl.
CPC ......... *H01R 43/0256* (2013.01); *H01R 12/57* (2013.01)

(58) Field of Classification Search
CPC .... H01R 43/0256; H01R 12/57; H01R 4/028; H01R 4/022; H01R 12/62; H05K 3/32
See application file for complete search history.

(56) References Cited

U.S. PATENT DOCUMENTS 5,772,451 A * 6/1998 Dozier, II .............. H05K 3/308
257/E21.507
5,879,215 A * 3/1999 Duffy ...................... H01J 9/247
445/63
(Continued)

FOREIGN PATENT DOCUMENTS

JP H10-284199 A 10/1998
JP 2006-253159 A 9/2006
(Continued)

OTHER PUBLICATIONS

Apr. 11, 2024 Office Action issued in Chinese Patent Application No. 202180011841.0.
(Continued)

*Primary Examiner* — Truc T Nguyen
(74) *Attorney, Agent, or Firm* — Oliff PLC (57) ABSTRACT

A method for manufacturing a connection body capable of suppressing deformation of a connector having a terminal array with a narrow pitch and obtaining excellent insulation and conductivity, and the connection body. The method includes: a step of fixing, on a first terminal array of a substrate, via a thermosetting connection material containing solder particles, a connector having a second terminal array having a minimum inter-terminal distance of 0.8 mm or less in the first terminal array and the second terminal array inside a bonding surface to be bonded with the substrate, and a step of joining the first terminal array and the second terminal array without a load by using a reflow
(Continued)

furnace set to a temperature equal to or higher than the melting point of the solder particles.

13 Claims, 5 Drawing Sheets

(56) References Cited

U.S. PATENT DOCUMENTS

| | | | | |
|---|---|---|---|---|
| 6,088,914 | A * | 7/2000 | Variot | H01L 21/67092 |
| | | | | 29/843 |
| 6,409,521 | B1 * | 6/2002 | Rathburn | H01R 12/714 |
| | | | | 439/66 |
| 6,533,590 | B1 * | 3/2003 | Lee | H01R 4/027 |
| | | | | 439/876 |
| 6,595,408 | B1 * | 7/2003 | Cobbley | H05K 3/3478 |
| | | | | 29/841 |
| 6,663,399 | B2 * | 12/2003 | Ali | H01R 12/52 |
| | | | | 439/71 |
| 6,792,679 | B1 * | 9/2004 | Tai | H05K 3/4038 |
| | | | | 174/262 |
| 8,444,043 | B1 * | 5/2013 | Bernier | B23K 1/203 |
| | | | | 228/179.1 |
| 8,621,750 | B2 * | 1/2014 | Schmachtenberg, III | |
| | | | | H05K 3/361 |
| | | | | 29/830 |

FOREIGN PATENT DOCUMENTS

| | | | |
|---|---|---|---|
| JP | 2007-158207 A | 6/2007 | |
| JP | 2016-127011 A | 7/2016 | |
| TW | 387635 U | 4/2000 | |
| WO | WO 2006073998 * | 7/2006 | H01R 12/57 |

OTHER PUBLICATIONS

Apr. 27, 2021 Search Report issued in International Patent Application No. PCT/JP2021/003371.
Sep. 16, 2024 Office Action issued in Chinese Patent Application No. 110104515.
Apr. 14, 2025 Office Action issued in Japanese Patent No. 2021-153568.

* cited by examiner

METHOD FOR MANUFACTURING CONNECTION BODY, AND CONNECTION BODY

TECHNICAL FIELD

The present technology relates to a method for manufacturing a connection body mounting connectors, and a connection body. This application claims priority on the basis of Japanese Patent Application Serial No. 2020-019992 filed Feb. 7, 2020 in Japan, which is incorporated herein by reference.

BACKGROUND ART

Conventionally, a connector is mounted on a substrate by providing solder paste on the substrate or by providing solder on a conductor portion of the connector (BGA) and then solder mounting the connector on the substrate by reflow (see, e.g., Patent Document 1). In recent years, in view of the demand for miniaturization of electronic equipment, there are needs for connectors having a pitch of 0.8 mm or less, or even 0.3 mm or less.

However, in the conventional connector mounting that uses a resist for the terminal array on the substrate side, it is difficult to further reduce the pitch of the connector. An example of the technique for connecting a terminal array having a narrow pitch is anisotropic connection; however, since the connector is usually a resin molded product, there is a concern in the anisotropic connection that the connector might be deformed by a pressure applied by a tool at the time of final pressure bonding, so that the cable cannot be inserted.

CITATION LIST

Patent Literature

Patent Document 1: Japanese Unexamined Patent Application Publication No. 10-284199

SUMMARY OF INVENTION

Technical Problem

The present technology is proposed in view of such conventional circumstances, and provides a method for manufacturing a connection body capable of suppressing deformation of a connector having a terminal array with a narrow pitch and obtaining excellent insulation and conductivity, and the connection body.

Solution to Problem

A method for manufacturing a connection body according to the present technology includes: a step of fixing, on a first terminal array of a substrate, a connector having a second terminal array having a minimum inter-terminal distance of 0.8 mm or less inside a bonding surface to be bonded with the substrate via a thermosetting connection material containing solder particles; and a step of joining the first terminal array and the second terminal array without a load by using a reflow furnace set to a temperature equal to or higher than the melting point of the solder particles.

A connection body according to the present technology includes: a substrate having a first terminal array; a connector having a second terminal array having a minimum inter-terminal distance of 0.8 mm or less inside a bonding surface to be bonded with the substrate; and an adhesive layer for joining the first terminal array to the second terminal array with solder particles and bonding the substrate and the connector.

Advantageous Effects of Invention

The present technology can suppress deformation of a connector having a terminal array with a narrow pitch and achieve excellent insulation and conductivity. Further, as a secondary effect, it is possible to save space, reduce weight, and reduce cost of a connection body having a connector.

DESCRIPTION OF EMBODIMENTS

Embodiments of the present technology will be described in detail in the following order with reference to the drawings.

1. METHOD FOR MANUFACTURING CONNECTION BODY
2. CONNECTION BODY
3. THERMOSETTING CONNECTION MATERIAL
4. EXAMPLES

1. Method for Manufacturing Connection Body

The method for manufacturing a connection body according to the present embodiment includes: a step of fixing, on a first terminal array of a substrate, a connector having a second terminal array having a minimum inter-terminal distance of 0.8 mm or less inside a bonding surface to be bonded with the substrate via a thermosetting connection material containing solder particles; and a step of joining the first terminal array and the second terminal array without a load by using a reflow furnace set to a temperature equal to or higher than the melting point of the solder particles. Here, the ratio of the average particle size of the solder particles to the minimum inter-terminal distance in the first terminal array and the second terminal array is preferably less than 0.15, and more preferably less than 0.1.

Here, the average particle diameter is the average value of the major axis diameter of the particles measured, e.g., at $N=20$ or more, preferably at $N=50$ or more, and more preferably at $N=200$ or more in an observation image by using a metal microscope, an optical microscope, an SEM (Scanning Electron Microscope), or the like, and is the average value of the diameter of the particles when the particles are spherical. In addition, the value may be a measured value measured by using a known image analysis software ("WinROOF" available from MITANI CORPORATION, "A-zo-kun (registered trademark)" available from Asahi Kasei Engineering Corporation) or a measured value (N=1,000 or more) measured by using an image type particle diameter distribution measuring device (e.g., FPIA-3000 (Malvern)). The average particle diameter obtained from the observation image or measured by the image type particle diameter distribution measuring device can be used as the average value of the maximum length of particles. In manufacturing of the thermosetting connection material, it is possible to simply use manufacturer values such as a particle diameter (D 50) at which the accumulated value in the particle diameter distribution obtained by the laser diffraction/scattering method reaches 50%, or an arithmetic average diameter (preferably on a volume basis), among other values. The connection body means a product formed by electrically connecting two materials or members. Joining means connecting and combining of two materials or members. Joining or bonding without a load means joining or bonding under a condition in which there is no mechanical pressurization.

The substrate is not particularly limited as long as wiring is provided, and may be defined in a broad sense as a so-called printed circuit board (PWB) provided with electrodes on which connectors can be mounted, and may be a rigid substrate or a flexible printed circuit board (FPC). Examples of substrates according to the type of the base material may include, e.g., glass substrates, ceramic substrates, and plastic substrates, among others.

The connector has a second terminal array having a minimum inter-terminal distance of 0.8 mm or less, and the second terminal array is formed at least inside a bonding surface to be bonded with the substrate, such that the connector body portion is overlapped with the first terminal array of the substrate. The minimum inter-terminal distance may be less than 0.35 mm. The first terminal array and the second terminal array (an array of electrodes or a group of electrodes) respectively provided on the substrate and the connector are arranged to face each other, and the terminal array may be provided on the substrate so that a plurality of connectors can be mounted on one substrate. In other words, the substrate may have a plurality of connectors joined at once.

Further, the connector having the second terminal array inside the bonding surface to be bonded with the substrate can apply a sufficient load in the vertical direction in the step of aligning the connector and fixing the connector, thereby bringing the solder particles into contact with the terminals of the substrate and the terminals of the connector to facilitate the removal of the oxide film on the surface of the solder particles. Alignment marks may be provided in order to facilitate the alignment of the connector and the substrate.

Preferably, the surfaces of the terminals of the substrate and the terminals of the connector are gold-plated. It is desirable that the substrate and the connector have heat resistance in the reflow process.

The connection body of the present embodiment is connected by solder particles widely used in BGA (ball grid array) and the like, and because of the high connection reliability, the connection body can be applied to many applications such as sensor devices, in-vehicle devices, and IoT (Internet of Things) devices. However, the solder particles are smaller than those used in BGA.

The thermosetting connection material may be either a film-like thermosetting connection film or a paste-like thermosetting connection paste. The thermosetting connection paste may be formed into a film at the time of connection, or may be formed into a form close to a film by mounting components.

In the case of the thermosetting connection paste, an application method such as dispensing, stamping, and screen printing may be used to uniformly apply a predetermined amount of the paste on the substrate, and the paste may be dried as necessary. In this case, it can be expected to reduce capital investment by diverting, modifying, or applying conventional solder paste facilities. Thermosetting connection films are particularly preferable because the amount of bonding material (e.g., an anisotropic conductive bonding material) can be made uniform based on the film thickness, and the film can be collectively laminated on the substrate to reduce the tact time. In addition, a film formed in advance is expected to improve the work efficiency since the film is easy to handle. In this case, a film laminating device or a bonding device may be provided or a conventional facility may be modified to have such a function in some cases as described later, thereby improving the efficiency of the work with a minimum capital investment.

Referring now to FIGS. 1 to 7, a step (A) of providing a thermosetting connection material on the first terminal array of the substrate, a step (B) of fixing the connector on the thermosetting connection material, and a step (C) of joining the first terminal array of the substrate and the second terminal array of the connector by using a reflow furnace set to a temperature equal to or higher than the melting point of the solder particles will be described.

Step (A)

Figure 1:
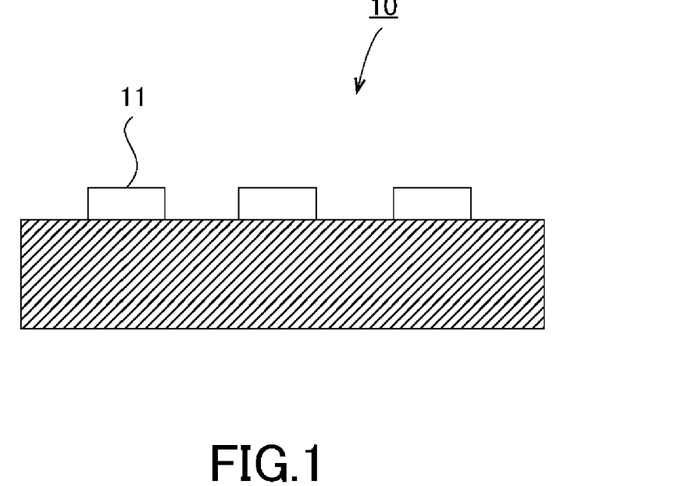
FIG. 1 is a cross-sectional view schematically illustrating an example of a substrate.
Figure 2:
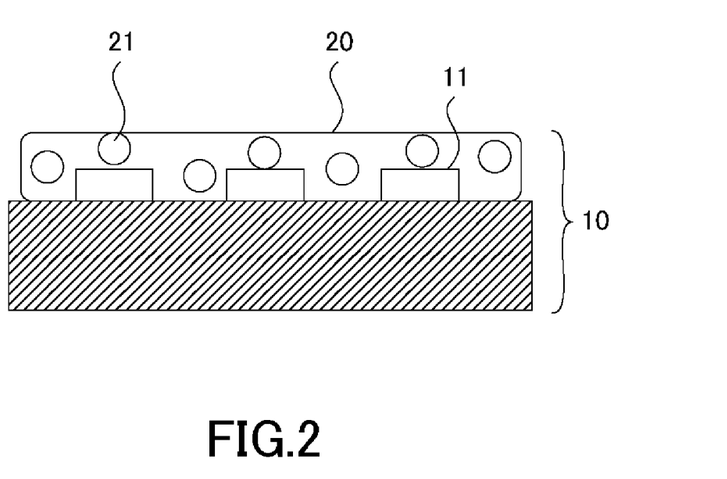
FIG. 2 is a cross-sectional view schematically illustrating a state in which a thermosetting connection material is provided on terminals of a substrate.

FIG. 1 is a cross-sectional view schematically illustrating an example of a substrate, and FIG. 2 is a cross-sectional view schematically illustrating a state in which a thermosetting connection material is provided on a terminal of the substrate. As shown in FIGS. 1 and 2, in step (A), a thermosetting connection material 20 containing solder particles 21 is provided on a first terminal array 11 of a substrate 10.

Step (A) may be a step of forming thermosetting connection paste into a film on the substrate, may be a temporary pasting step of pasting a thermosetting connection film on the substrate at a low temperature and a low pressure, as used in conventional conductive films and anisotropic conductive films, or may be a laminating step of laminating a thermosetting connection film on the substrate.

When step (A) is a temporary pasting step, a thermosetting connection film can be provided on the substrate under known conditions. This case is economically advantageous because this requires only a minimum change such as installation or modification of a tool to or from the existing facility.

When step (A) is a laminating step, a thermosetting connection film is laminated on the substrate by using, e.g., a pressure type laminator. The laminating step may be vacuum pressurized lamination step. Temporary pasting of a conventional conductive film or an anisotropic conductive film using a heating/pressing tool will limit the width of the film by the width of the tool, while laminating step uses no heating/pressing tool so that it is expected that a relatively wide width can be mounted at once. Alternatively, one thermosetting connection film may be laminated to one substrate. This can reduce the time required for the step of providing the thermosetting connection material, since the vertical movement of the heating/pressing tool and the conveyance of the thermosetting connection film are not performed a plurality of times.

In step (A), since the bonding material is provided on the substrate, the thickness of the thermosetting bonding material is required to be within a predetermined range. If the thickness of the thermosetting connection material is too thin, although the effect of facilitating the holding of the solder particles between the electrodes can be expected, the difficulty in forming into a film shape increases and the technical difficulty in forming on the substrate increases; therefore, the lower limit of the thickness of the thermosetting connection material is 50% or more, preferably 80% or more, more preferably 90% or more of the average particle size of the solder particles. The upper limit of the thickness of the thermosetting connection material is 300% or less, preferably 200% or less, more preferably 150% or less of the average particle size of the solder particles. If the thickness of the thermosetting connection material is too thick, there is a possibility of causing trouble in joining or bonding.

Further, in consideration of the pressing of the connector in step (B) described later, it is preferable that the thermosetting connection material is easily removed to the extent that the solder particles are held, and therefore, the upper limit of the ratio of the average particle size of the solder particles to the thickness of the thermosetting connection material is preferably 1.4 or less, more preferably 1.2 or less, and still more preferably 1.0 or less. If the ratio of the average particle size of the solder particles to the thickness of the thermosetting connection material is too large, a high pressure is required at the time of pressing the connector in step (B), which might damage the connector.

Step (B)

Figure 3:
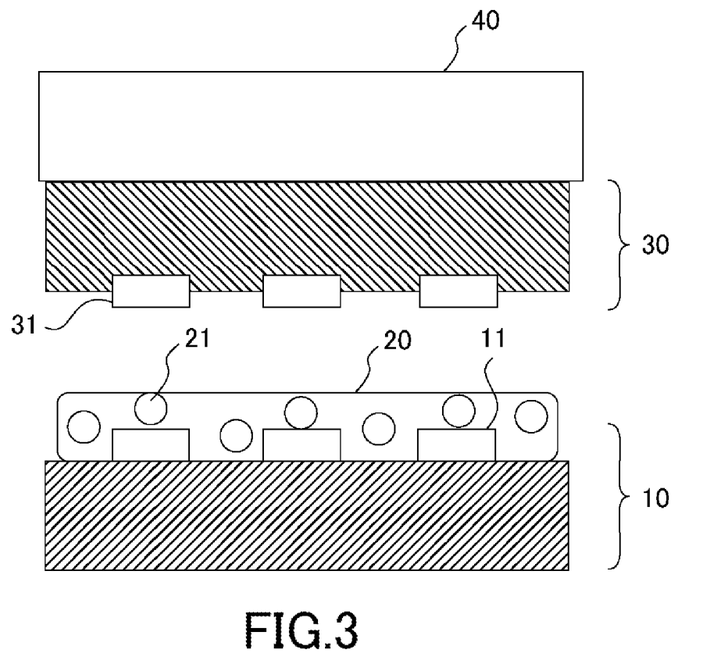
FIG. 3 is a cross-sectional view schematically illustrating alignment of a first terminal array of a substrate with a second terminal array of a connector.
Figure 4:
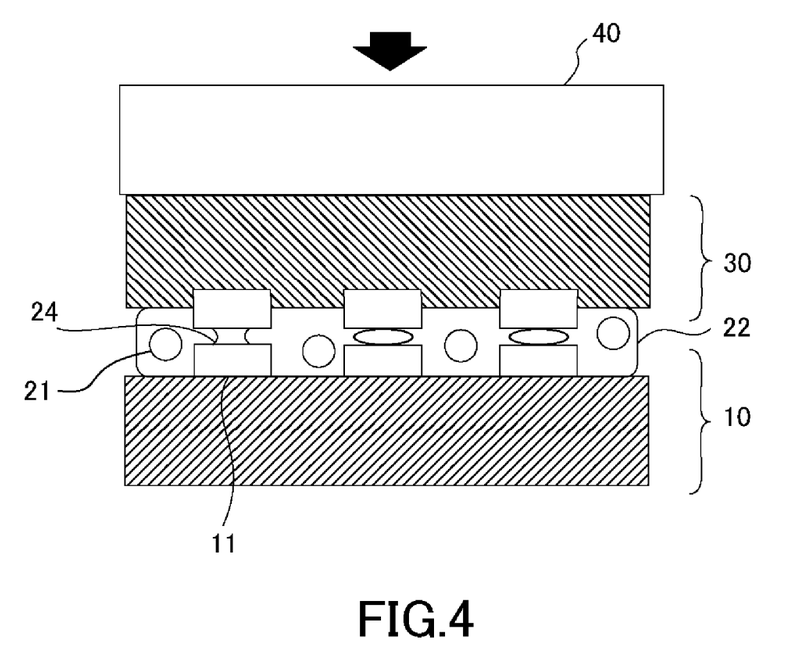
FIG. 4 is a cross-sectional view schematically illustrating a state in which the connector side is pressed with a tool.

FIG. 3 is a cross-sectional view schematically illustrating alignment of the terminal array of the substrate and the terminal array of the connector, and FIG. 4 is a cross-sectional view schematically illustrating a state in which the connector side is pressed with a tool. As shown in FIGS. 3 and 4, in step (B), the terminal array 11 of the substrate 10 is aligned with a terminal array 31 of a connector 30, and then the connector 30 is fixed on the thermosetting connection material 20. Since self-alignment by solder is not expected in this technology, it is desirable in step (B) that the substrate 10 is accurately aligned and then fixed by the thermosetting connection material 20.

In step (B), a tool 40 is used to align the first terminal array 11 of the substrate 10 with the second terminal array 31 of the connector 30, and then the connector 30 is mounted on the thermosetting connection material 20. The tool 40 is preferably a heating type pickup tool and preferably has a suction mechanism for sucking the connector 30.

Further, step (B) is preferably a temporary pressure bonding in which the connector 30 side is pressed with the tool 40. The pressure for pressing the connector 30 is larger than that in step (A), and is applied to the electrode area where the first terminal array of the substrate 10 and the second terminal array of the connector 30 face each other, and the upper limit of the pressure is not particularly limited as long as it does not deform the connector body or mounted components. The lower limit of the pressure may be, e.g., more than 1.0 MPa, more than 2.0 MPa, more than 3.0 MPa, or more than 5.0 MPa. As shown in FIG. 4, the purpose of the temporary pressure bonding is to surely hold the solder particles 21 between the electrodes of the first terminal array 11 of the substrate 10 and the second terminal array 31 of the connector 30 and apply heat to the solder particles 21 to bring them into a melted state at a solder joined portion 24 or a state close to it, thereby making the solder particles 21 to work advantageously for joining between the electrodes accompanying the melting of the solder particles in the reflow process. Thus, the oxide film on the surface of the solder particles can be removed. In the temporary pressure bonding, the first terminal array 11 of the substrate 10 and the second terminal array 31 of the connector 30 may be directly brought into contact with each other to relatively reduce the degree of contribution of the solder particles to the joining in the reflow process, thereby achieving stable conductivity. By bringing the first terminal array of the substrate 10 and the second terminal array of the connector 30 into direct contact with each other and making the solder particles present in the vicinity thereof, the solder particles become unloaded and contribute to the joining of the electrodes of the connector and the electrodes of the substrate only by being melted in the reflow process; this also easily achieve fine pitch connection because the blending amount of the solder particles is of a level that will not cause self-alignment. Solder joining by such a temporary pressure bonding and reflow process is one of the differences between the present technology and a connection method using a general solder paste or BGA. It should be noted that, from the viewpoint of making it easy to utilize the conventional knowledge, the temporary pressure bonding conditions may be the same as those of a general anisotropic connection. One of the temporary pressure bonding conditions used for the general anisotropic connection is preferably 2.0 MPa or less, more preferably 1.5 MPa or less, more preferably 1.0 MPa or less. The lower limit of the pressure is preferably 0.2 MPa or more, more preferably 0.4 MPa or more. Even under these conditions, the objective can be achieved by adjusting the conditions of the solder particles and the adhesive binder until the unloaded connection (reflow process). Since the upper and lower limits may vary depending on the specifications of the device, they are not limited to the above numerical ranges as long as the thermosetting connection material 20 can be pushed until the opposing electrodes are brought into contact with each other or to the solder particle size.

In step (B), it is preferable to press the connector at a temperature in the range of the minimum melt viscosity reaching temperature of the thermosetting connection material −30° C. to +60° C., and it is more preferable to press the connector at a temperature in the range of the minimum melt viscosity reaching temperature of the thermosetting connection material −10° C. to +40° C. This range reduces the melt viscosity of the thermosetting connection material so that the solder particles 21 can be held between the first terminal array 11 of the substrate 10 and the second terminal array 31 of the connector 30 even if the pressure for pressing the connector is reduced. Further, in step (B), as long as the solder particles 21 are held between the first terminal array 11 of the substrate 10 and the second terminal array 31 of the connector 30, or the respective electrodes are in contact with each other via melted or partially melted solder, the thermosetting connection material of a thermosetting resin layer 22 may have started to be cured, may be in a semi-cured state called B-stage in which the thermosetting connection material is not completely cured, or may be completely cured. This is because the curing may be completely finished during the reflow process, or the resin may be melted after curing and joining between the electrodes by solder particles may be achieved by the own weight of the connector (without a load). From the viewpoint of manufacturing control, it is preferable that these connection schemes are selectable.

In step (B), a buffer material may be used between the tool 40 and the connector 30. As the buffer material, polytetrafluoroethylene (PTFE), silicon rubber, or the like can be used. This can further suppress damage to the connector 30.

Step (C)

Figure 5:
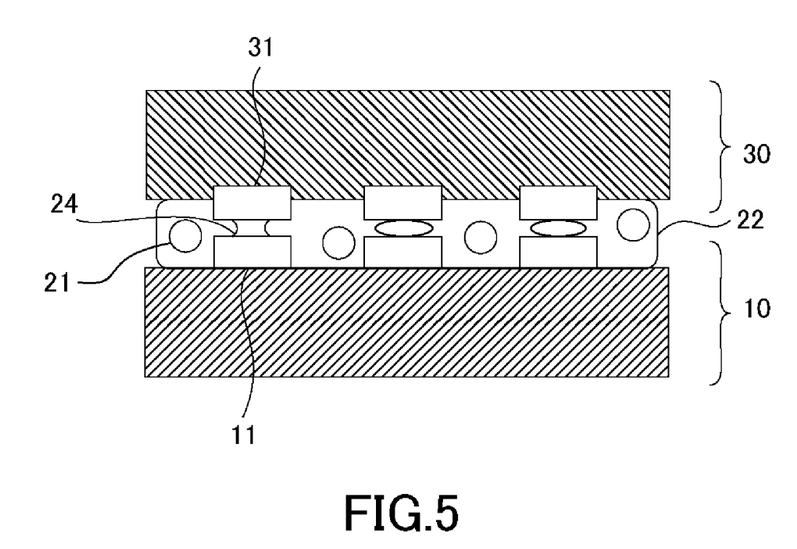
FIG. 5 is a cross-sectional view schematically illustrating a state in which the connector is fixed to the substrate.
Figure 6:
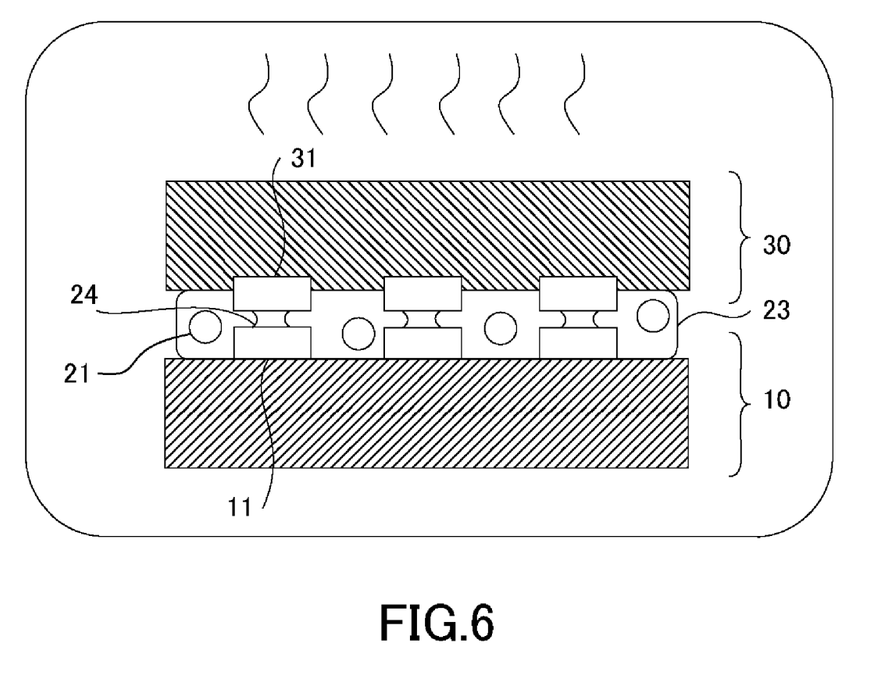
FIG. 6 is a cross-sectional view schematically illustrating a state in which the substrate and the connector are heated in a reflow furnace.
Figure 7:
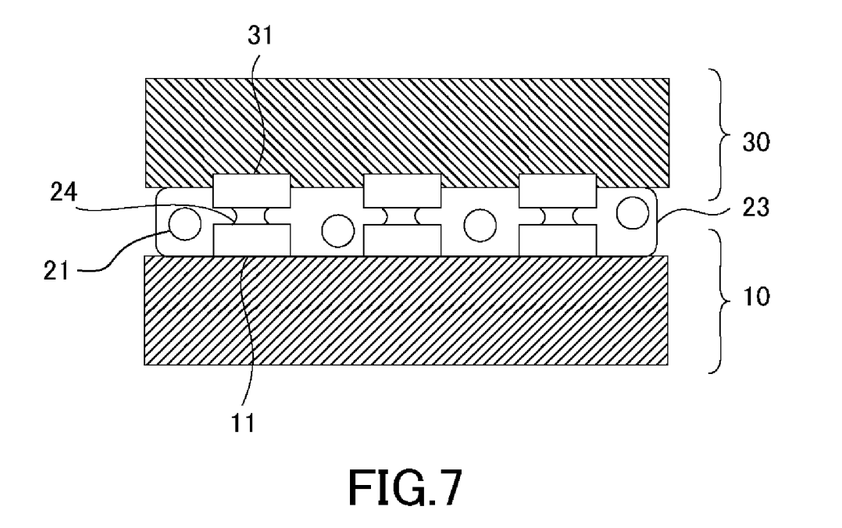
FIG. 7 is a cross-sectional view schematically illustrating a connection body.

FIG. 5 is a cross-sectional view schematically illustrating a state in which the connector is fixed to the substrate, FIG. 6 is a cross-sectional view schematically illustrating a state in which the substrate and the connector are heated in a reflow furnace, and FIG. 7 is a cross-sectional view schematically illustrating a connection body. As shown in FIGS. 5 to 7, in step (C), the first terminal array 11 of the substrate 10 and the second terminal array 31 of the connector 30 are joined by using a reflow furnace set to a temperature equal to or higher than the melting point of the solder particles 21.

Since the reflow furnace can heat-bond the substrate 10 and the connector 30 without a load without applying mechanical pressure, damage to the substrate 10 and the connector 30 can be suppressed. Further, as compared with an anisotropic conductive connection using a general heating and pressurizing tool, this does not generate an unnecessary flow of resin, thereby suppressing the entrainment of bubbles. In addition, joint without load is expected to reduce the amount of movement of the solder particles, thereby improving the capturing efficiency of the solder particles. The electrodes may be in direct contact with each other and this contact may be held by an adhesive. In addition, solder particles in the vicinity of connected electrodes may act to assist the connection. The solder particles may be held between the electrodes, or solder particles existing around the electrodes may melt and contribute to joining after the electrodes are directly connected to each other. Therefore, it is preferable that the content of the solder particles is such that the solder particles are not self-aligned. This is one of the differences between the present technology and general anisotropic conductive connections. In other words, in the present technology, conduction may be achieved through solder particles serving as conductive particles (a state same as or similar to the anisotropic connection), the electrodes may be in direct contact with each other and the adhesive may hold them to achieve conduction (a state different from the anisotropic connection), or solder particles present in the vicinity of the electrodes may contribute to conduction and the connection between the electrodes in an assisting manner.

Examples of the reflow furnace may include an atmospheric pressure reflow, a vacuum reflow, an atmospheric pressure oven, and an autoclave (pressurized oven), and among these, it is preferable to use a vacuum reflow or an autoclave capable of eliminating air bubbles contained in the bonding portion.

The lower limit of the peak temperature (maximum reaching temperature) in the reflow furnace may be the temperature at which the solder particles melt and the temperature at which the thermosetting binder begins to cure, and is preferably 150° C. or more, more preferably 180° C. or more, and still more preferably 200° C. or more. The upper limit of the peak temperature in the reflow furnace is 300° C. or less, more preferably 290° C. or less, sill more preferably 280° C. or less. As a result, the first terminal array 11 of the substrate 10 and the second terminal array 31 of the connector 30 are joined at the solder joined portion 24. Further, since the content of the solder particles 21 in the thermosetting connection material is such that self-alignment cannot be expected, a large number of the solder particles 21 are not integrated, and a plurality of the solder joined portions 24 exist in one terminal. When the thermosetting connection material is a thermosetting binder, the portion other than the plurality of the solder joined portions 24 in the terminals are bonded by the thermosetting binder. Here, the solder joining means connecting of the respective pair of electrodes of the opposed electronic components by melting solder.

In the reflow furnace, the thermosetting resin is melted by heating, and the solder particles 31 held between the electrodes are melted by the main heating conducted at a temperature higher than the solder melting point, so that the solder wets and spreads to the electrodes, and the first terminal array 11 of the substrate 10 and the second terminal array 31 of the connector 30 are joined by cooling. The reflow may include, in addition to a temperature raising step and a temperature lowering step, a temperature maintaining step (keeping step) for keeping the furnace at a constant temperature. There may be a peak step in which the reflow is at the highest temperature, and reflow may include intermediate steps in the middle of temperature raising or temperature lowering. The temperature raising step may consist of two steps of a step of melting the binder (e.g., up to 120° C.) and a step of melting and spreading the solder particles (e.g., 120 to 175° C.). Therefore, the heating rate may be 10 to 120° C./min or 20 to 100° C./min. The holding time of the keeping step (e.g., 175 to 180° C.) also serves as a step for curing the binder. This temperature is, e.g., a temperature of 160 to 230° C., which may differ by about 5 to 10° C., and may be the same as the peak temperature. This time can be selected suitably, e.g., 0.5 min or more or 0.75 min or more, and 5 min or less or 3 min or less since excessively long time will deteriorate the manufacturing efficiency. The reflow may be constituted by only the temperature raising step and the temperature lowering step, and in this case, the cured resin may be melted in both steps, the solder particles 31 held between the electrodes may be melted by the main heating conducted at a temperature higher than the solder melting point, so that the solder wets and spreads to the electrodes, and the first terminal array 11 of the substrate 10 and the second terminal array 31 of the connector 30 may be joined by cooling. The process can be controlled by the time exceeding a predetermined temperature. The predetermined temperature is preferably 150° C., more preferably 180° C. or more, still more preferably 200° C. or more. The predetermined time is, e.g., 0.5 min. By cooling the solder particles (below the melting point of the solder particles) through the temperature lowering step, the solder particles can be made into a solid phase to join electrodes. The temperature lowering rate should be high in order to achieve quick taking-out to improve the productivity, and should be low in order to avoid rapid cooling to improve the quality of the connection body. As an example, the rate may be the same as that of the temperature raising step, preferably 10 to 30° C./min. The temperature lowering rate can be adjusted according to the combination of the target object to be joined and the conditions of the binder to be used. It is also affected by the temperature at which it is taken out and its environment.

According to the above-described method for manufacturing the connection body, joining can be achieved more easily by approximating the solder particles to the film thickness before the reflow step and bringing the solder particles into contact with the terminals. When the thermosetting connection material is a thermosetting binder, it is possible to optimize resin melting, holding of solder particles between terminals, and solder melting and resin curing in the reflow process by matching the temperature raising, the temperature keeping, and the temperature lowering in the reflow process with the thermosetting behavior of the thermosetting connection material. The thermosetting behavior of the thermosetting connection material can be known by DSC measurement or viscosity measurement by a rheometer.

Further, the apparatus for manufacturing the connection body includes: a material providing part for providing a thermosetting connection material containing solder particles on a first terminal array of the substrate; a fixing part for fixing a connector on the thermosetting connection material; and a reflow furnace for joining the first terminal array of the substrate and the second terminal array of the connector.

When the thermosetting connection material is a film, the material providing part may be a temporary pasting device for pasting the film on the substrate at a low temperature and a low pressure, or a laminating device for laminating the film on the substrate. When the thermosetting connection material is paste, the material providing part may be an application device for uniformly applying a predetermined amount of the paste on the substrate. The fixing part may be a flip-chip bonder having a heating mechanism and a pressurizing mechanism, and the connector is fixed on the thermosetting connection material by sucking and aligning the connector with a tool and pushing down the tool. A device conventionally used for connector connection may be used for this alignment and fixing. The maximum temperature of the reflow furnace is set to be a temperature equal to or higher than the melting point of the solder particles, and the solder particles are heated while the connector is fixed to the substrate, so that the solder particles join the terminals of the substrate and the terminals of the connector.

2. Connection Body

FIG. 7 is a cross-sectional view schematically illustrating a connection body. As shown in FIG. 7, the connection body according to the present embodiment includes: the substrate 10 having the first terminal array 11; the connector 30 having the second terminal array 31; and an adhesive layer 23 for joining the first terminal array 11 and the second terminal array 31 with solder particles 21 at the solder joined portion 24, and for bonding the substrate 10 and the connector 30.

The upper limit of the minimum inter-terminal distance between adjacent terminals (space distance) in the first terminal array 11 and the second terminal array 31 is 0.8 mm or less, preferably 0.3 mm or less, and more preferably 0.2 mm or less. The lower limit of the minimum inter-terminal distance in the first terminal array 11 and the second terminal array 31 is 50 μm or more, preferably 60 μm or more, and still more preferably 70 μm or more.

The upper limit of the ratio of the average particle size of the solder particles 21 to the minimum inter-terminal distance (space distance) in the first terminal array 11 and the second terminal array 31 is less than 0.15, and more preferably less than 0.1.

By the relation between the inter-terminal distance in the first terminal array 11 and the second terminal array 31 and the average particle size of the solder particles 21 as described above, the first terminal array 11 of the substrate 10 and the second terminal array 31 of the connector 30 can be joined by using a reflow furnace.

The substrate 10 is the same as described above, and examples of substrates according to the type of the base material may include, e.g., a rigid substrate, a glass substrate, a ceramic substrate, and a plastic substrate. From the viewpoint of economic efficiency, it is preferable that short-circuit-preventing processes (e.g., walls and grooves) used for solder resist are not formed between adjacent terminals of the first terminal array. In other words, the height of the inter-terminal portion from the terminal of the first terminal array 11 is preferably 100 μm or less, more preferably 35 μm or less, and still more preferably 12 μm or less. The lower limit of the height of the inter-terminal portion from the terminal of the first terminal array 11 may be the same as the terminal height (a state in which the terminals are horizontal and identical to the substrate surface, and there is no protrusion of the terminals, and the connection surface of the substrate is flat), or the terminals of the first terminal array provided on the substrate may project from the substrate plane. Thus, in step (B), the solder particles 21 can be easily sandwiched between the first terminal array 11 of the substrate 10 and the second terminal array 31 of the connector 30 in a contact state.

The adhesive layer 23 is formed by curing the thermosetting connection material of the thermosetting resin layer 22 after step (C) to form a film, so that the first terminal array 11 of the substrate 10 and the second terminal array 31 of the connector 30 are soldered 34 to each other and the thermosetting connection material is filled between the substrate 10 and the connector 30. There exist a plurality of solder joined portions 24 in one terminal, and when the thermosetting connection material is a thermosetting binder, the portions other than the plurality of solder joined portions 24 are bonded by the thermosetting binder.

In the present specification, the connector is mainly a resin molded article having a fitting portion. In the fitting portion, e.g., a terminal or a plug of an FPC is fitted, and the pitch of the terminal to be fitted is preferably 0.8 mm or less, more preferably 0.3 mm or less, and still more preferably 0.2 mm or less. The connector can electrically connect and mechanically couple the component inserted into the fitting portion on which the connector is mounted. For example, a resin molded product may have a plurality of electrodes protruding in the longitudinal direction (so-called centipede connector), and may also have non-protruding electrodes (flip-chip type connectors). Even in the case of a connector having a narrow pitch, the connector can be fixed at a low pressure as described above, and can be heat-bonded without a load by using a reflow furnace.

Figure 8:
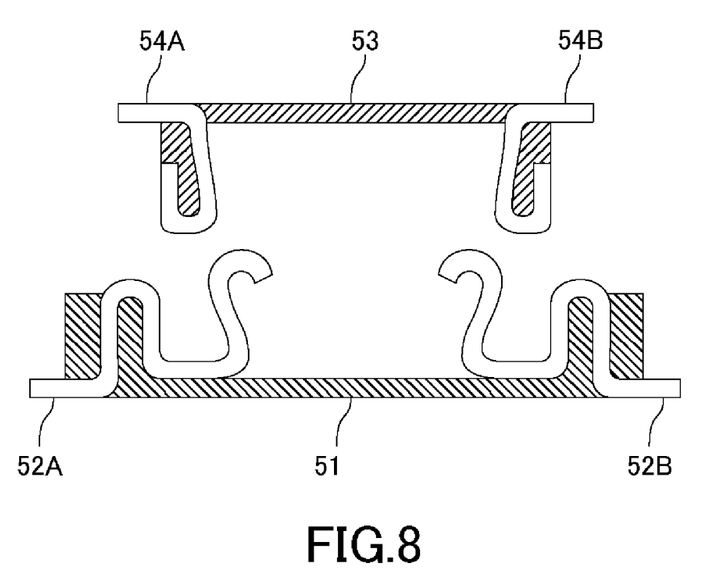
FIG. 8 is a cross-sectional view illustrating an example of a short direction of the connector.

FIG. 8 is a sectional view illustrating an example of the connector in the short direction. The connector is of a vertical fitting type, and includes a receptacle in which a first terminal 52A and a second terminal 52B are fixed by an insulating resin 51, and a plug in which a first terminal 54A and a second terminal 54B are fixed by an insulating resin 53. The first terminal 52A and the second terminal 52B, as well as the first terminal 54A and the second terminal 54B are formed at a predetermined pitch in the longitudinal direction of the connector. In this connector, e.g., the first terminal 52A or the second terminal 52B of the receptacle corresponds to the second terminal array 31 of the connector 30 of the longitudinal cross section shown in FIG. 3.

The insulating resins 51 and 53 are made of, e.g., polyamide or LCP, and the first terminal 52A and the second terminal 52B, as well as the first terminal 54A and the second terminal 54B are fixed by, e.g., resin molding.

The metal of the first terminal 52A and the second terminal 52B, as well as the first terminal 54A and the second terminal 54B are bent so that the first terminals 52A, 54A and the second terminals 52B, 54B are mutually vertically fitted. Further, leads are formed at the ends of the receptacle and the plug in the short direction, respectively, so that centipede type terminals are formed.

The present embodiment can fix the connector at a low pressure and conduct heat-bonding without a load by using a reflow furnace without applying mechanical pressure, so that the connector having a narrow pitch can be mounted. Further, since the present embodiment does not require the lead, the flip-chip type connector having the second terminal array can be mounted on the inside of the bonding surface to be bonded with the substrate so that the mounting area can be reduced. The connector according to the present technology (into which a FPC or the like is inserted for use) is thicker in the connection direction than the FPC or IC chip used for general anisotropic conductive connection. Therefore, there is a concern that misalignment (meaning that the first terminal array and the second terminal array are offset from each other) due to pressurization (pressing) at the time of connection is more likely to occur than in general anisotropic connection. However, such a technical problem can be avoided by, as described above, temporarily fixing the material after alignment and conducting heat-bonding by using a reflow furnace without a load without applying mechanical pressure.

It can be said that this technology is required for this reason.

3. Thermosetting Connection Material

In the thermosetting connection material according to the present embodiment, solder particles are dispersed in a thermosetting binder, and the content of the solder particles is 50 wt % or less. Thus, it is possible to fix the connector on the thermosetting connection material and conduct reflow to suppress the occurrence of the self-alignment of the solder particles, so that the connector with a terminal array having a pitch of 0.8 mm or less can be mounted.

The lower limit of the mass ratio range of the blending amount of the solder particles is preferably 20 wt % or more, more preferably 30 wt % or more, and still more preferably 35 wt % or more, and the upper limit of the mass ratio range of the blending amount of the solder particles is preferably 50 wt % or less, more preferably 45 wt % or less, and still more preferably 40 wt % or less. The lower limit of the volume ratio range of the blending amount of the solder particles is preferably 5 vol % or more, more preferably 10 vol % or more, and still more preferably 15 vol % or more, and the upper limit of the volume ratio range of the blending amount of the solder particles is preferably 30 vol % or less, more preferably 25 vol % or less, and still more preferably 20 vol % or less. The blending amount of the solder particles satisfying the mass ratio range or the volume ratio range described above can achieve excellent conductivity, heat dissipation, and adhesion. When the solder particles are present in the binder, blending may be based on the volume ratio, and when the anisotropic conductive bonding material is to be manufactured (before the solder particles are present in the binder), blending may be based on the mass ratio. The mass ratio can be converted into the volume ratio according to the specific gravity of the blended material and the blending ratio, among others. If the blending amount of the solder particles is insufficient, excellent conductivity, heat dissipation, and adhesiveness cannot be achieved, and if the blending amount is excessive, anisotropy can easily be impaired, and excellent conductivity reliability cannot be achieved.

The thermosetting connection material preferably has an exothermic peak temperature higher than the melting point of the solder particles and preferably has a melting temperature lower than the melting point of the solder particles. Here, the exothermic peak temperature can be measured by using a rotary rheometer (manufactured by Thermo Fisher) under conditions of a measuring pressure of 1 N, temperature range of 30 to 200° C., a temperature rising speed of 10° C./min, a measuring frequency of 1 Hz, and a measuring plate diameter of 8 mm. Thus, since the thermosetting binder is melted by heating, and the solder is melted while the solder particles are held between the terminals, it is possible to join the electronic components having electrodes of a fine pitch.

When the thermosetting connection material is in the form of a film as described above, the lower limit of the ratio of the average particle size of the solder particles to the thickness of the thermosetting connection material is preferably 0.6 or more, more preferably 0.8 or more, and still more preferably 0.9 or more. When the ratio of the average particle diameter of the solder particles to the thickness of the thermosetting connection material is large, the solder particles can be easily held between the electrodes in step (B), but the difficulty in handling may be increased when the solder particles are formed into a film.

The upper limit of the ratio of the average particle size of the solder particles to the thickness of the thermosetting connection material is preferably 1.5 or less, more preferably 1.2 or less, and still more preferably 1.1 or less. If the ratio of the average particle size of the solder particles to the thickness of the thermosetting connection material is large, a high pressure is required to press the connector in step (B), which may damage the connector.

The film thickness can be measured by using a known micrometer or digital thickness gauge capable of measuring 1 μm or less, preferably 0.1 μm or less (e.g., MDE-25M available from MITSUTOYO, minimum display size 0.0001 mm). The film thickness may be determined by measuring 10 or more locations and averaging them. However, when the film thickness is smaller than the particle diameter, a contact type thickness measuring instrument is not suitable, and a laser displacement meter (e.g., Spectroscopic Interference Displacement Type SI-T Series available from Keyence) is preferably used. Here, the film thickness is the thickness of only the resin layer and does not include the particle diameter.

Thermosetting Binder

Examples of the thermosetting binder (insulating binder) may include a thermal radical polymerization type resin composition containing a (meth) acrylate compound and a thermal radical polymerization initiator, a thermal cation polymerization type resin composition containing an epoxy compound and a thermal cation polymerization initiator, and a thermal anion polymerization type resin composition containing an epoxy compound and a thermal anion polymerization initiator. Known pressure-sensitive adhesive compositions may also be used. The (meth) acrylic monomer includes both an acrylic monomer and a methacrylic monomer.

Hereinafter, a thermal anion polymerization type resin composition containing a solid epoxy resin, a liquid epoxy resin, and an epoxy resin curing agent will be described as a specific example.

The solid epoxy resin is not particularly limited as long as it is solid at normal temperature and has one or more epoxy groups in the molecule, and may be, e.g., a bisphenol A epoxy resin or a biphenyl epoxy resin. Thus, the film shape can be maintained. The normal temperature is in the range of 20° C.±15° C. (5° C. to 35° C.) as defined in JIS Z 8703.

The liquid epoxy resin is not particularly limited as long as it is liquid at normal temperature, and may be, e.g., a bisphenol A type epoxy resin, a bisphenol F type epoxy resin, or a urethane-modified epoxy resin.

The blending amount of the liquid epoxy resin is preferably 160 parts by mass or less, more preferably 100 parts by mass or less, still more preferably 70 parts by mass or less with respect to 100 parts by mass of the solid epoxy resin. When the blending amount of the liquid epoxy resin is excessive, it becomes difficult to maintain the film shape.

The epoxy resin curing agent is not particularly limited as long as it is a thermosetting agent that starts curing by heat, and examples thereof include anionic curing agents such as amines and imidazoles, and cationic curing agents such as sulfonium salts. The curing agent may also be microencapsulated to provide resistance to the solvent used in the film formation.

The thermosetting binder preferably contains no flux compound. This can improve the insulation property, eliminate the necessity of the cleaning step of the flux compound, and reduce the time of the oxide film removing step in the reflow step.

Solder Particles

The solder particles are preferably dispersed in the thermosetting connection material, and the solder particles may be randomly arranged or arranged in a certain regular pattern. The average particle size can be confirmed by extracting at least five arbitrary locations of an area of 1 mm² or more in the plane view of the film using a known metal microscope or optical microscope.

The solder particles may be agglomerates in which a plurality of solder particles are agglomerated. The average particle size of each solder particle of the aggregate can be measured in the same manner as the average particle size described above.

The average particle diameter of the solder particles is preferably 0.2 times or less of the minimum inter-terminal distance (space distance) in the first terminal array of the substrate and the second terminal array of the connector, which are the adherends. If the average particle size of the solder particles is larger than 0.2 times the minimum inter-terminal distance in the first terminal array of the substrate and the second terminal array of the connector, a short circuit is likely to occur.

The lower limit of the average particle size of the solder particles is preferably 0.5 µm or more, more preferably 3 µm or more, and still more preferably 5 µm or more. This can make the application thickness of the film constant. The average particle size of the solder particles smaller than 0.5 µm may not achieve a good solder joining state with the electrode portion, and tends to deteriorate reliability. The upper limit of the average particle size of the solder particles may be 50 µm or less, preferably 30 µm or less, more preferably 20 µm or less, still more preferably 10 µm or less. In the case where the solder particles forms an agglomerate in which a plurality of solder particles are agglomerated, the size of the agglomerate may be equal to the average particle size of the solder particles. In the case of the agglomerate, the average particle size of the solder particles may be smaller than the above value. The size of each solder particle can be determined by observing with an electron microscope as described above.

The maximum diameter of the solder particles may be 200% or less of the average particle diameter, preferably 150% or less of the average particle diameter, and more preferably 120% or less of the average particle diameter. By setting the maximum diameter of the solder particles within the above range, the solder particles can be held between the electrodes, and the electrodes can be joined by melting the solder particles. In the case of an agglomerate formed by agglomerating a plurality of solder particles, the size of the agglomerate may be equal to the maximum diameter of the solder particles. In the case of the agglomerate, the maximum diameter of the solder particles may be smaller than the above value. The size of each solder particle can be determined by observing with an electron microscope as described above.

The solder particles can be suitably selected from, e.g., Sn—Pb, Pb—Sn—Sb, Sn—Sb, Sn—Pb—Bi, Bi—Sn, Sn—Cu, Sn—Pb—Cu, Sn—In, Sn—Ag, Sn—Pb—Ag, and Pb—Ag, specified in JIS Z 3282-1999 according to the electrode material and connection conditions. The lower limit of the melting point of the solder particles is preferably 110° C. or more, more preferably 120° C. or more, still more preferably 130° C. or more. The upper limit of the melting point of the solder particles may be 200° C. or less, preferably 180° C. or less, more preferably 160° C. or less, still more preferably 150° C. or less. The solder particles may have a flux compound directly bonded to the surface for the purpose of activating the surface. Activating the surface can promote metal bonding with the electrode portion.

Other Additives

In addition to the insulating binder and solder particles described above, the thermosetting bonding material may be formulated with various additives conventionally used in heat-curable adhesives without impairing the effects of the present invention. The particle size of the additive is preferably smaller than the average particle size of the solder particles, but is not particularly limited as long as the particle size does not interfere with the joining between electrodes.

The above-described thermosetting connection material can be formed, e.g., by mixing an insulating binder and solder particles in a solvent, applying the mixture into a predetermined thickness on a release-treated film by a bar coater, and then drying the mixture to volatilize the solvent. Further, after the mixture is applied on the release-treated film by a bar coater, a pressure may be applied in order for the mixture to have a predetermined thickness. Further, in order to increase the dispersibility of the solder particles, it is preferable to apply a high share in a state containing a solvent. For example, a known batch type planetary stirring machine can be used. The residual solvent amount of the thermosetting connection material is preferably 2% or less, more preferably 1% or less.

EXAMPLES

4. Examples

As the examples, adhesive films containing solder particles were prepared, and flexible printed boards were mounted on rigid boards as a substitute for a connector by using the adhesive film. Then, insulation evaluation and connection resistance value evaluation of the mounting body were performed. The present embodiment is not limited to these examples.

Insulation Evaluation of Mounting Body

For the mounting samples, resistance values between adjacent terminals were measured, and $10^6 \Omega$ or less was counted as a short. Mounting bodies with no short were evaluated as "GOOD", and mounting bodies with at least one short were evaluated as "BAD".

Connection Resistance Value Evaluation of Mounting Body

For the mounting body sample, by flowing a current of 1 mA through each terminal between the flexible printed board and the rigid board, the resistance value was measured, and the median value was calculated. Mounting bodies with a median resistance value of 0.1 Ω or less was evaluated as "GOOD" and other mounting bodies were evaluated as "BAD".

Mounting Example 1-1

A flexible printed board (manufactured by Dexerials, FPC for evaluation, 100 μm terminal width, 100 μm (minimum) inter-terminal distance, 1:1 line and space, 200 μm pitch, 30 terminals, Ni—Au plating) and a rigid board (manufactured by Dexerials, rigid substrate for evaluation, 100 μm terminal width, 100 μm (minimum) inter-terminal distance, 200 μm pitch, 30 terminals, 18 μm thick Cu pattern, Ni—Au plating) are prepared.

Under the mounting conditions of 90° C., 2 s, and 1 MPa, the flexible printed circuit board was aligned and fixed on the rigid board through an adhesive film. The used adhesive film was a film having a thickness of 12 μm in which an acrylic thermosetting binder (manufactured by Dexerials, minimum melt viscosity reaching temperature of 80° C.) was blended with 38 wt % of solder particles (MP-L20, manufactured by Senju Metal Industry, Sn-58 Bi alloy, solid state temperature 139° C.) having an average particle size of 10 μm.

Thereafter, the flexible printed circuit board was mounted on the rigid circuit board by reflow. The reflow conditions were 150° C. to 260° C., 100 sec, and peak top temperature of 260° C.

Table 1 shows the results of insulation evaluation and connection resistance value evaluation of the mounting body.

Mounting Example 1-2

As shown in Table 1, a mounting body was manufactured in the same manner as in MOUNTING EXAMPLE 1-1 except that the mounting condition were set to 100° C., 2 s, and 1 MPa, and insulation evaluation and connection resistance value evaluation of the mounting body were performed.

Mounting Example 1-3

As shown in Table 1, a mounting body was manufactured in the same manner as in MOUNTING EXAMPLE 1-1 except that the mounting conditions were set to 130° C., 2 s, and 1 MPa, and insulation evaluation and connection resistance value evaluation of the mounting body were performed.

Mounting Example 1-4

As shown in Table 1, a mounting body was manufactured in the same manner as in MOUNTING EXAMPLE 1-1, except that the mounting condition were set to 150° C., 2 s, and 1 MPa, and insulation evaluation and connection resistance value evaluation of the mounting body were performed.

Mounting Example 2-1

A flexible printed board (manufactured by Dexerials, FPC for evaluation, 300 μm terminal width, 300 μm (minimum) inter-terminal distance, 1:1 line and space, 300 μm pitch, 30 terminals, Ni—Au plating) and a rigid board (manufactured by Dexerials, rigid substrate for evaluation, 300 μm terminal width, 300 μm (minimum) inter-terminal distance, 300 μm pitch, 30 terminals, 18 μm thick Cu pattern, Ni—Au plating) are prepared.

Under the mounting condition of 90° C., 2 s, and 1 MPa, the flexible printed circuit board was aligned and fixed on the rigid board through an adhesive film. The used adhesive film was a film having a thickness of 35 μm in which an acrylic thermosetting binder (manufactured by Dexerials, minimum melt viscosity reaching temperature of 80° C.) was blended with 38 wt % of solder particles (MP-L 20, manufactured by Senju Metal Industry, Sn-58 Bi alloy, solid state temperature 139° C.) having an average particle size of 30 μm.

Thereafter, the flexible printed circuit board was mounted on the rigid circuit board by reflow. The reflow conditions were 150° C. to 260° C., 100 sec, and peak top temperature of 260° C.

Table 1 shows the results of insulation evaluation and connection resistance value evaluation of the mounting body.

Mounting Example 2-2

As shown in Table 1, a mounting body was manufactured in the same manner as in MOUNTING EXAMPLE 2-1 except that the mounting conditions were set to 100° C., 2 s, and 1 MPa, and insulation evaluation and connection resistance value evaluation of the mounting body were performed.

Mounting Example 2-3

As shown in Table 1, a mounting body was manufactured in the same manner as in MOUNTING EXAMPLE 2-1 except that the mounting conditions were set to 130° C., 2 s, and 1 MPa, and insulation evaluation and connection resistance value evaluation of the mounting body were performed.

Mounting Example 2-4

As shown in Table 1, a mounting body was manufactured in the same manner as in MOUNTING EXAMPLE 2-1 except that the mounting conditions were set to 150° C., 2 s, and 1 MPa, and insulation evaluation and connection resistance value evaluation of the mounting body were performed.

Mounting Example 3-1

A flexible printed board (manufactured by Dexerials, FPC for evaluation, 100 μm terminal width, 100 μm (minimum) inter-terminal distance, 1:1 line and space, 100 μm pitch, 30 terminals, Ni—Au plating) and a rigid board (manufactured by Dexerials, rigid substrate for evaluation, 100 μm terminal width, 100 μm (minimum) inter-terminal distance, 100 μm pitch, 30 terminals, 18 μm thick Cu pattern, Ni—Au plating) are prepared.

Under the mounting conditions of 90° C., 2 s, and 1 MPa, the flexible printed circuit board was aligned and fixed on the rigid board through an adhesive film. The used adhesive film was a film having a thickness of 28 μm in which an acrylic thermosetting binder (manufactured by Dexerials, minimum melt viscosity reaching temperature of 80° C.) was blended with 38 wt % of solder particles (MP-L20, manufactured by Senju Metal Industry, Sn-58 Bi alloy, solid state temperature 139° C.) having an average particle size of 30 μm.

Thereafter, the flexible printed circuit board was mounted on the rigid circuit board by reflow. The reflow conditions were 150° C. to 260° C., 100 sec, and peak top temperature of 260° C.

Table 1 shows the results of insulation evaluation and connection resistance value evaluation of the mounting body.

Mounting Example 3-2

As shown in Table 1, a mounting body was manufactured in the same manner as in MOUNTING EXAMPLE 3-1 except that the mounting conditions were set to 100° C., 2 s, and 1 MPa, and insulation evaluation and connection resistance value evaluation of the mounting body were performed.

Mounting Example 3-3

As shown in Table 1, a mounting body was manufactured in the same manner as in MOUNTING EXAMPLE 3-1 except that the mounting conditions were set to 130° C., 2 s, and 1 MPa, and insulation evaluation and connection resistance value evaluation of the mounting body were performed.

Mounting Example 3-4

As shown in Table 1, a mounting body was manufactured in the same manner as in MOUNTING EXAMPLE 3-1 except that the mounting conditions were set to 150° C., 2 s, and 1 MPa, and insulation evaluation and connection resistance value evaluation of the mounting body were performed.

Mounting Example 4-1

A flexible printed board (manufactured by Dexerials, FPC for evaluation, 100 μm terminal width, 100 μm (minimum) inter-terminal distance, 1:1 line and space, 100 μm pitch, 30 terminals, Ni—Au plating) and a rigid board (manufactured by Dexerials, rigid substrate for evaluation, 100 μterminal width, 100 μm (minimum) inter-terminal distance, 100 μm pitch, 30 terminals, 18 μm thick Cu pattern, Ni—Au plating) are prepared.

Under the mounting conditions of 90° C., 2 s, and 1 MPa, the flexible printed circuit board was aligned and fixed on the rigid board through an adhesive film. The used adhesive film was a film having a thickness of 35 μm in which an acrylic thermosetting binder (manufactured by Dexerials, minimum melt viscosity reaching temperature of 80° C.) was blended with 38 wt % of solder particles (MP-L20, manufactured by Senju Metal Industry, Sn-58 Bi alloy, solid state temperature 139° C.) having an average particle size of 30 μm.

Thereafter, the flexible printed circuit board was mounted on the rigid circuit board by reflow. The reflow conditions were 150° C. to 260° C., 100 sec, and peak top temperature of 260° C.

Table 2 shows the results of insulation evaluation and connection resistance value evaluation of the mounting body.

Mounting Example 4-2

As shown in Table 2, a mounting body was manufactured in the same manner as in MOUNTING EXAMPLE 4-1, except that the mounting conditions were set to 100° C., 2 s, and 1 MPa, and insulation evaluation and connection resistance value evaluation of the mounting body were performed.

Mounting Example 4-3

As shown in Table 2, a mounting body was manufactured in the same manner as in MOUNTING EXAMPLE 4-1 except that the mounting conditions were set to 130° C., 2 s, and 1 MPa, and insulation evaluation and connection resistance value evaluation of the mounting body were performed.

Mounting Example 4-4

As shown in Table 2, a mounting body was manufactured in the same manner as in MOUNTING EXAMPLE 4-1 except that the mounting conditions were set to 150° C., 2 s, and 1 MPa, and insulation evaluation and connection resistance value evaluation of the mounting body were performed.

Mounting Example 5-1

A flexible printed board (manufactured by Dexerials, FPC for evaluation, 200 μm terminal width, 200 μm (minimum) inter-terminal distance, 1:1 line and space, 200 μm pitch, 30 terminals, Ni—Au plating) and a rigid board (manufactured by Dexerials, rigid substrate for evaluation, 200 μm terminal width, 200 μm (minimum) inter-terminal distance, 200 μm pitch, 30 terminals, 18 μm thick Cu pattern, Ni—Au plating) are prepared.

Under the mounting conditions of 90° C., 2 s, and −1 MPa, the flexible printed circuit board was aligned and fixed on the rigid board through an adhesive film. The used adhesive film was a film having a thickness of 35 μm in which an acrylic thermosetting binder (manufactured by Dexerials, minimum melt viscosity reaching temperature of 80° C.) was blended with 38 wt % of solder particles (MP-L20, manufactured by Senju Metal Industry, Sn-58 Bi alloy, solid state temperature 139° C.) having an average particle size of 30 μm.

Thereafter, the flexible printed circuit board was mounted on the rigid circuit board by reflow. The reflow conditions were 150° C. to 260° C., 100 sec, and peak top temperature of 260° C.

Table 2 shows the results of insulation evaluation and connection resistance value evaluation of the mounting body.

Mounting Example 5-2

As shown in Table 2, a mounting body was manufactured in the same manner as in MOUNTING EXAMPLE 5-1 except that the mounting conditions were set to 100° C., 2 s, and 1 MPa, and insulation evaluation and connection resistance value evaluation of the mounting body were performed.

Mounting Example 5-3

As shown in Table 2, a mounting body was manufactured in the same manner as in MOUNTING EXAMPLE 5-1 except that the mounting conditions were set to 130° C., 2 s, and 1 MPa, and insulation evaluation and connection resistance value evaluation of the mounting body were performed.

Mounting Example 5-4

As shown in Table 2, a mounting body was manufactured in the same manner as in MOUNTING EXAMPLE 5-1 except that the mounting conditions were set to 150° C., 2 s, and 1 MPa, and insulation evaluation and connection resistance value evaluation of the mounting body were performed.

body having excellent insulation and conductivity could be obtained when the minimum inter-terminal distance was 0.3 mm or less, and the ratio of the average particle size of the solder particles to the minimum inter-terminal distance was less than 0.15. In addition, it was revealed that a mounting body having excellent insulation and conductivity could be obtained when the temperature at the time of alignment is set to 100° C. to 150° C. with respect to the adhesive film having the minimum melt viscosity reaching temperature of 80° C.

Although the flexible printed circuit boards were mounted in these examples, a connector may be mounted. The connector not only of a centipede type but also of a flip-chip type can be mounted.

REFERENCE SIGNS LIST 10 substrate, 11 first terminal array, 20 thermosetting connection material, 21 solder particles, 30 connector, 31 second terminal array, 40 tool, 51 insulating resin, 52A first terminal, 52B second terminal, 53 insulating resin, 54A first terminal, 54B second terminal

The invention claimed is:
1. A method for manufacturing a connection body comprising:
a step of fixing, on a first terminal array of a substrate, a connector having a second terminal array having a minimum inter-terminal distance of 0.8 mm or less

| | EX. 1-1 | EX. 1-2 | EX. 1-3 | EX. 1-4 | EX. 2-1 | EX. 2-2 | EX. 2-3 | EX. 2-4 | EX. 3-1 | EX. 3-2 | EX. 3-3 | EX. 3-4 |
|---|---|---|---|---|---|---|---|---|---|---|---|---|
| solder particle diameter [um] | 10 | | | | 30 | | | | 30 | | | |
| inter-terminal distance [um] | 100 | | | | 300 | | | | 100 | | | |
| film thickness [um] | 12 | | | | 35 | | | | 28 | | | |
| solder particle diameter/inter-terminal distance | 0.1 | | | | 0.1 | | | | 0.3 | | | |
| solder particle diameter/film thickness | 0.83 | | | | 0.86 | | | | 1.07 | | | |
| component alignment temperature [° C.] | 90 | 100 | 130 | 150 | 90 | 100 | 130 | 150 | 90 | 100 | 130 | 150 |
| insulation evaluation | GOOD | GOOD | GOOD | GOOD | GOOD | GOOD | GOOD | GOOD | BAD (Short) | BAD (Short) | BAD (Short) | BAD (Short) |
| connection resistance value evaluation | BAD (OPEN) | GOOD | GOOD | GOOD | BAD (OPEN) | GOOD | GOOD | GOOD | BAD (OPEN) | GOOD | GOOD | GOOD |

| | EX. 4-1 | EX. 4-2 | EX. 4-3 | EX. 4-4 | EX. 5-1 | EX. 5-2 | EX. 5-3 | EX. 5-4 |
|---|---|---|---|---|---|---|---|---|
| solder particle diameter [um] | 30 | | | | 30 | | | |
| inter-terminal distance [um] | 100 | | | | 200 | | | |
| film thickness [um] | 35 | | | | 35 | | | |
| solder particle diameter/inter-terminal distance | 0.3 | | | | 0.15 | | | |
| solder particle diameter/film thickness | 0.86 | | | | 0.86 | | | |
| component alignment temperature [° C.] | 90 | 100 | 130 | 150 | 90 | 100 | 130 | 150 |
| insulation evaluation | BAD (Short) | BAD (Short) | BAD (Short) | BAD (Short) | BAD (Short) | BAD (Short) | BAD (Short) | BAD (Short) |
| connection resistance value evaluation | BAD (OPEN) | GOOD | GOOD | GOOD | BAD (OPEN) | GOOD | GOOD | GOOD |

MOUNTING EXAMPLE 1-2 to MOUNTING EXAMPLE 1-4 and MOUNTING EXAMPLE 2-2 to MOUNTING EXAMPLE 2-4 revealed that a mounting inside a bonding surface to be bonded with the substrate via a thermosetting connection material containing solder particles; and a step of joining the first terminal array and the second terminal array without a load by using a reflow furnace set to a temperature equal to or higher than the melting point of the solder particles.

2. The method for manufacturing a connection body according to claim 1, wherein the ratio of an average particle diameter of the solder particles to a minimum inter-terminal distance in the first terminal array and the second terminal array is less than 0.15.

3. The method for manufacturing a connection body according to claim 1, wherein in the step of fixing the connector, the connector is pressure bonded at a temperature in a range of −10° C. to +40° C. relative to a minimum melt viscosity reaching temperature of the thermosetting connection material.

4. The method for manufacturing a connection body according to claim 1, wherein in the step of fixing the connector, the connector is pressure bonded at a pressure of 2.0 MPa or less.

5. The method for manufacturing a connection body according to claim 1, wherein the connector is a resin molded product.

6. The method for manufacturing a connection body according to claim 1, wherein the content of the solder particles in the thermosetting connection material is 50 wt % or less.

7. The method for manufacturing a connection body according to claim 1, wherein the thermosetting connection material is in the form of a film.

8. A connection body, comprising:
a substrate having a first terminal array;
a connector having a second terminal array having a minimum inter-terminal distance of 0.8 mm or less inside a bonding surface to be bonded with the substrate; and
an adhesive layer for joining the first terminal array to the second terminal array with solder particles and bonding the substrate and the connector,
wherein the adhesive layer is a hardened product of a thermosetting connection material having an exothermic peak temperature higher than the melting point of the solder particles and a melting temperature lower than the melting point of the solder particles, and
wherein the substrate has no solder resist between adjacent terminals.

9. The connection body according to claim 8, wherein the connector has the minimum inter-terminal distance of 0.3 mm or less.

10. The connection body according to claim 8, wherein the ratio of an average particle diameter of the solder particles to a minimum inter-terminal distance in the first terminal array and the second terminal array is less than 0.15.

11. The method for manufacturing a connection body according to claim 1, wherein the connector has the minimum inter-terminal distance of 0.3 mm or less.

12. The method for manufacturing a connection body according to claim 1, wherein the thermosetting connection material has an exothermic peak temperature higher than the melting point of the solder particles and a melting temperature lower than the melting point of the solder particles.

13. The method for manufacturing a connection body according to claim 1, wherein the substrate has no solder resist between adjacent terminals.

* * * * *